(12) United States Patent
Kobayashi et al.

(10) Patent No.: US 9,225,352 B2
(45) Date of Patent: Dec. 29, 2015

(54) SIGNAL TRANSMISSION SYSTEM, PHOTOELECTRIC CONVERSION APPARATUS, AND IMAGE PICKUP SYSTEM

(71) Applicant: CANON KABUSHIKI KAISHA, Tokyo (JP)

(72) Inventors: Daisuke Kobayashi, Kawaguchi (JP); Tomoya Onishi, Ayase (JP); Takeru Ohya, Machida (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 88 days.

(21) Appl. No.: 13/782,286

(22) Filed: Mar. 1, 2013

(65) Prior Publication Data

US 2013/0242154 A1 Sep. 19, 2013

(30) Foreign Application Priority Data

Mar. 7, 2012 (JP) ................ 2012-050689

(51) Int. Cl.
*H03M 1/12* (2006.01)
*H04N 5/335* (2011.01)
*H04N 5/378* (2011.01)

(52) U.S. Cl.
CPC ............. *H03M 1/12* (2013.01); *H04N 5/3355* (2013.01); *H04N 5/378* (2013.01)

(58) Field of Classification Search
CPC ... H04N 3/1575; H04N 5/335; H04N 5/3355; H03M 1/36; H03M 1/12
USPC .................. 348/308, 302, 294; 341/126, 159
See application file for complete search history.

(56) References Cited

U.S. PATENT DOCUMENTS

| | | | |
|---|---|---|---|
| 8,698,931 B2* | 4/2014 | Kobayashi et al. | 348/308 |
| 2010/0005253 A1* | 1/2010 | Lee et al. | 711/155 |
| 2010/0149394 A1* | 6/2010 | Yamazaki et al. | 348/308 |
| 2010/0214462 A1* | 8/2010 | Itakura | 348/302 |

FOREIGN PATENT DOCUMENTS

JP 2010-147684 A 7/2010

* cited by examiner

*Primary Examiner* — Nhan T Tran
(74) *Attorney, Agent, or Firm* — Canon USA, Inc. IP Division

(57) ABSTRACT

A signal apparatus includes a plurality of pairs, each pair of which includes plural digital signal output units configured to output a digital signal, a block wiring to which output terminals of the plural digital signal output units are connected, and a buffer circuit an input terminal of which is connected to the block wiring, in which the output terminal of the buffer circuit included in one of the pairs is connected to the block wiring included in another one of the pairs.

10 Claims, 17 Drawing Sheets

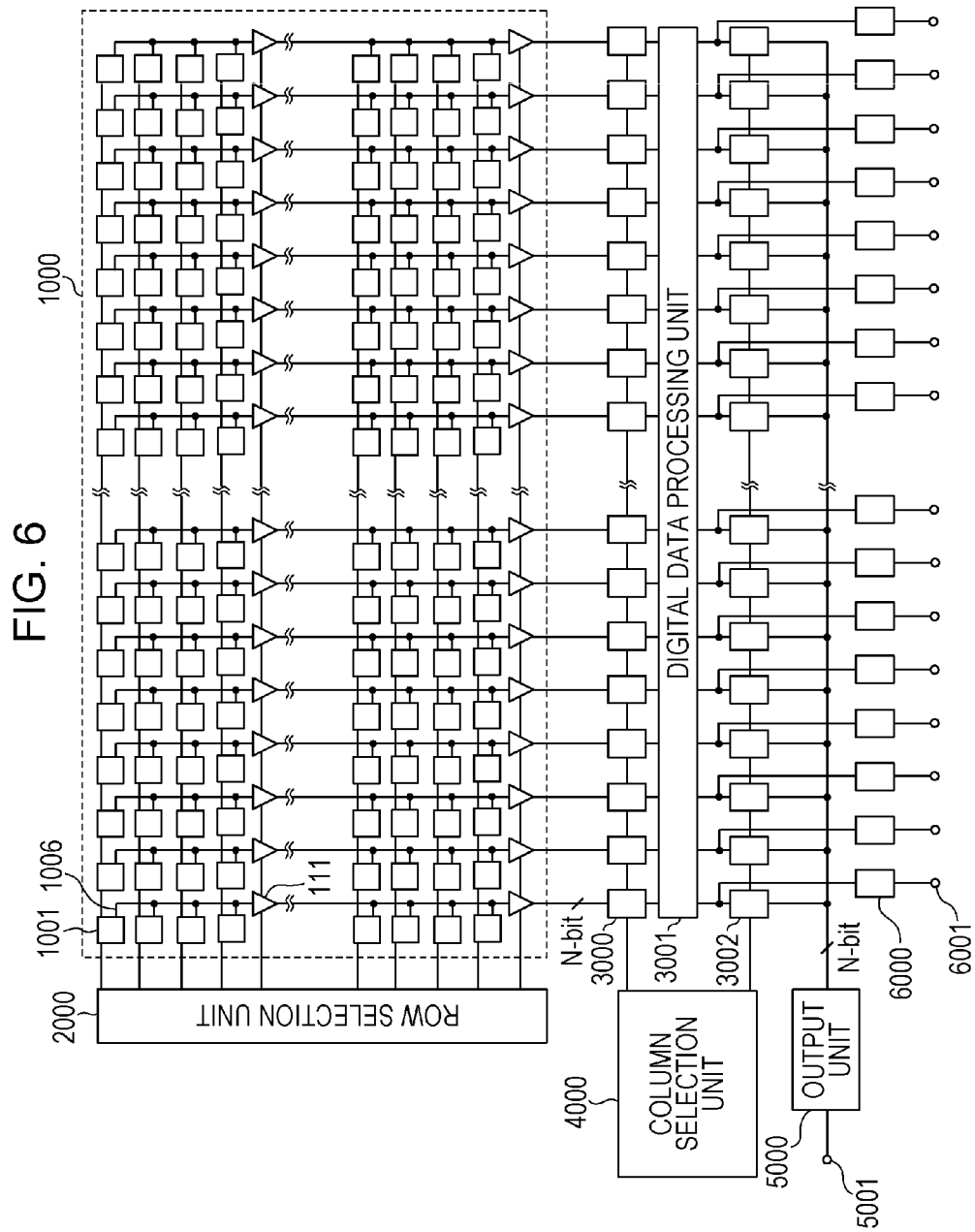

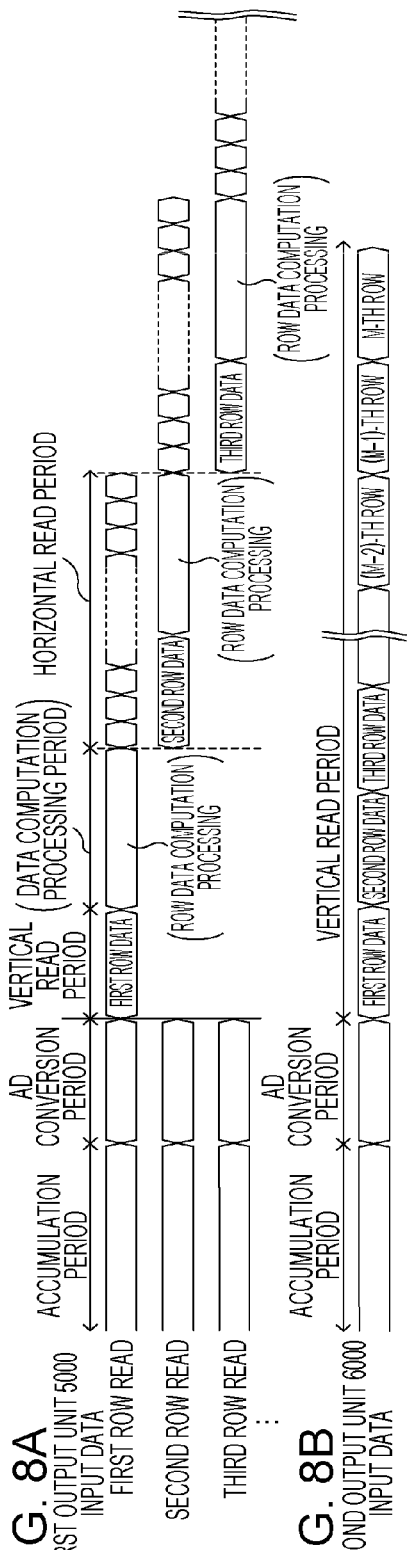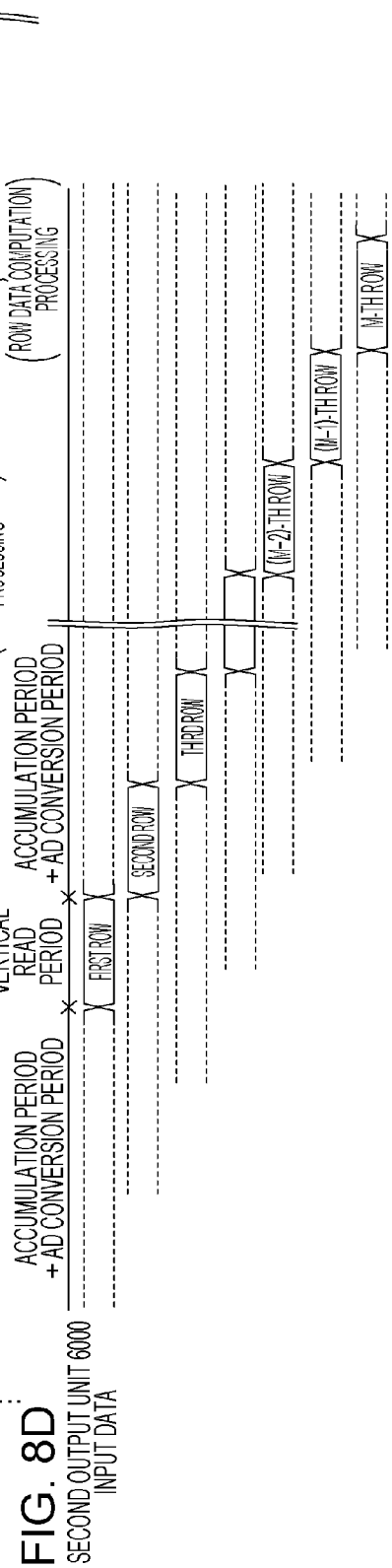

SIGNAL TRANSMISSION SYSTEM, PHOTOELECTRIC CONVERSION APPARATUS, AND IMAGE PICKUP SYSTEM

BACKGROUND OF THE INVENTION

1. Field of the Invention

One disclosed aspect of the embodiments relates to a signal transmission system, a photoelectric conversion apparatus, an image pickup system, and a drive method for the photoelectric conversion apparatus. In particular, an aspect of the embodiments relates to a signal transmission system provided with a plurality of analog-to-digital (A/D) converters that are arranged in parallel.

2. Description of the Related Art

An image pickup apparatus is proposed which is provided with A/D converters on respective columns of a pixel array where pixels are arranged in a matrix or on plural columns and configured to perform a signal processing in parallel. Digital data obtained through an A/D conversion is stored in a memory, and thereafter, the stored digital data is selected by a scanning circuit to be output from the image pickup apparatus.

Japanese Patent Laid-Open No. 2010-147684 discloses that plural memories are set as a block, and a wiring from which data is output (hereinafter, which will be referred to as data output line) is allocated for each block. In this specification, a configuration is disclosed in which selection circuits are provided for the respective block wirings, and either digital data output from the associated block wiring or digital data output from another selection circuit is selected to be output.

However, according to the configuration disclosed in Japanese Patent Laid-Open No. 2010-147684, in addition to the wiring for each block, a wiring between the selection circuits is also used. For that reason, not only an impediment is posed on a higher speed in a data transfer, but also a size of a layout area is increased.

SUMMARY OF THE INVENTION

One disclosed aspect of the embodiments aims at solving the above-described problems.

According to an aspect of the embodiments, there is provided a signal transmission apparatus including a plurality of pairs. Each pair of the plurality of pairs includes a plurality of digital signal output units configured to output a digital signal, a block wiring to which output terminals of the plural digital signal output units are connected, and a buffer circuit having an input terminal connected to the block wiring. The output terminal of the buffer circuit included in one of the plurality of pairs is connected to the block wiring included in another one of the plurality of pairs.

According to another aspect of the embodiments, there is provided a signal transmission apparatus including: plural digital signal output units arranged in parallel; and plural output selectors connected in series, in which each of the plural output selectors selectively outputs a signal that is output from one digital signal output unit or a signal that is output from another output selector.

Further features of the disclosure will become apparent from the following description of embodiments with reference to the attached drawings.

BRIEF DESCRIPTION OF THE DRAWINGS

FIG. 6 is a block diagram of a configuration of the photoelectric conversion apparatus according to a second embodiment.

FIGS. 8A, 8B, 8C, and 8D are timing charts of an operation according to the second embodiment.

DESCRIPTION OF THE EMBODIMENTS

A photoelectric conversion apparatus is exemplified as a signal transmission apparatus provided with plural digital signal output units that are arranged in parallel and configured to output digital signals. A use of the embodiments is not limited to the photoelectric conversion apparatus.

One disclosed feature of the embodiments may be described as a process which is usually depicted as a timing diagram. A timing diagram may illustrate the timing relationships of several entities, such as signals, events, etc. Although a timing diagram may describe the operations as a sequential process, some operations may be performed in parallel or concurrently. In addition, unless specifically stated, the order of the operations or timing instants may be re-arranged. Furthermore, the timing or temporal distances may not be scaled or depict the timing relationships in exact proportions.

First Embodiment

Figure 1:
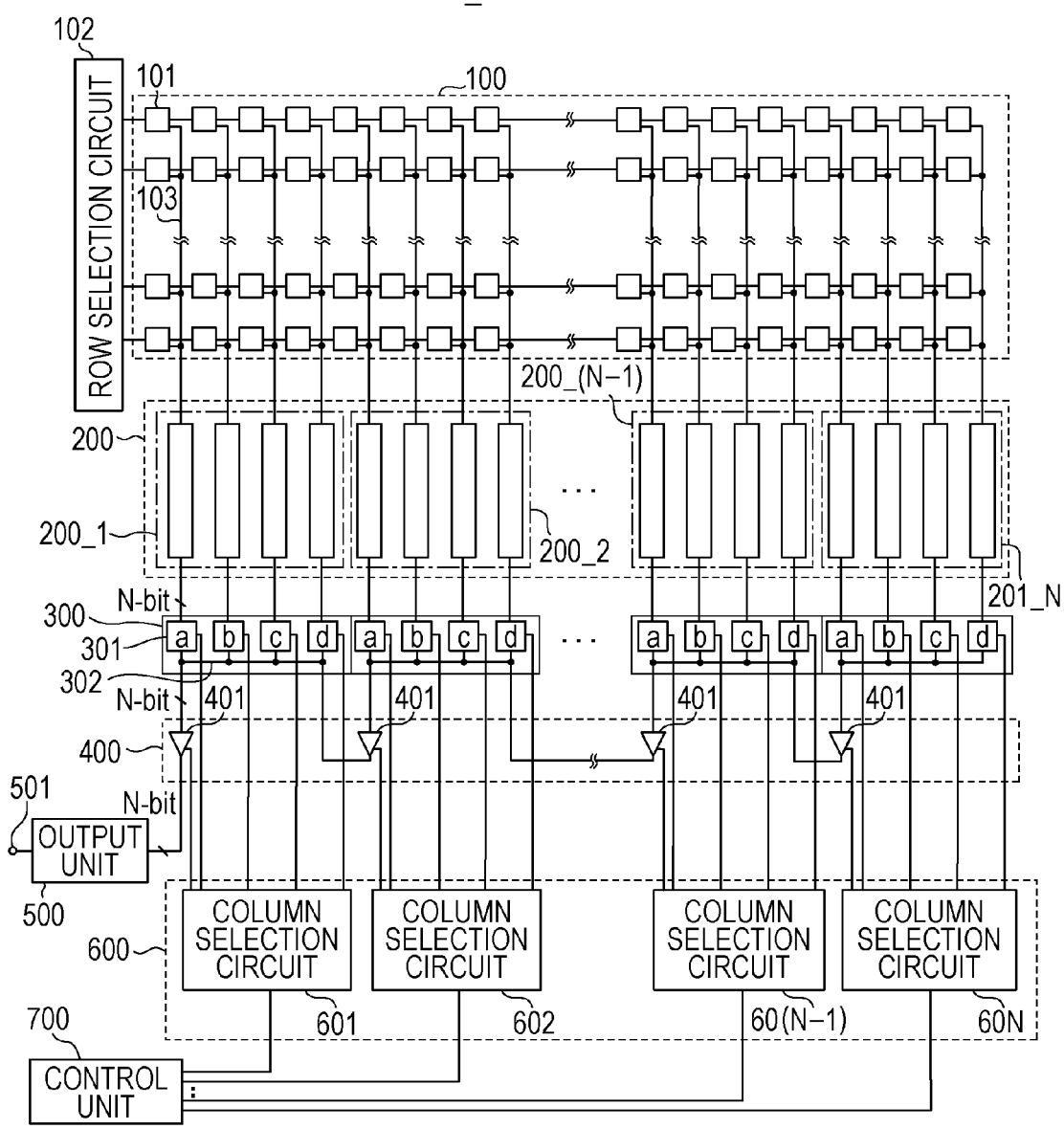
FIG. 1 is a block diagram of a configuration of a photoelectric conversion apparatus according to a first embodiment.

FIG. 1 illustrates a configuration of the photoelectric conversion apparatus according to the present embodiment. Herein, the configuration including a pixel array 100 in which pixels 101 are arranged in a matrix of M rows×N columns and signal processing circuits 200 are provided on the respective columns of the pixel array 100 will be described as an example.

A photoelectric conversion apparatus 1 includes the pixel array 100, a group of the signal processing circuits 200, a memory group 300, a buffer circuit group 400, and an output unit 500. The photoelectric conversion apparatus 1 may further include a row selection circuit 102, a column selection circuit 600, and a control unit 700.

Figure 2:
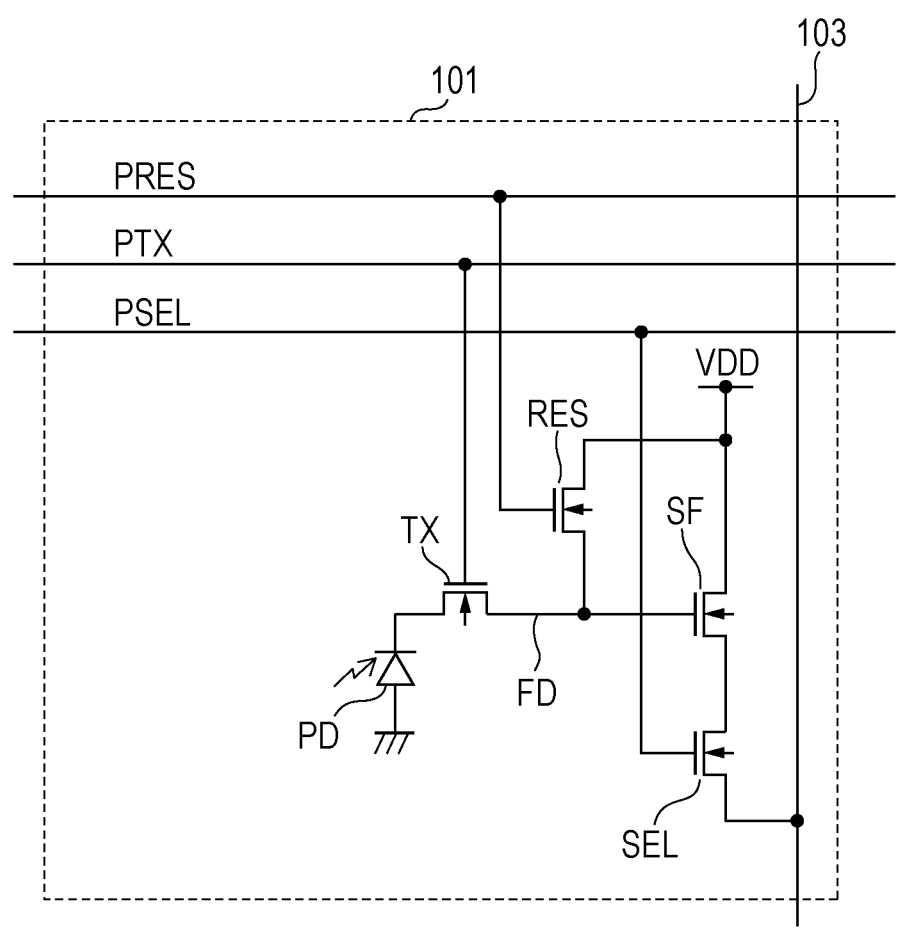
FIG. 2 is an equivalent circuit diagram of a pixel according to the first embodiment.

FIG. 2 is an equivalent circuit diagram of the pixel 101. The pixel 101 includes a photoelectric conversion unit PD and outputs a signal in accordance with the charge amount obtained through a photoelectric conversion to a signal line 103.

The pixel 101 includes the photoelectric conversion unit PD, a transfer transistor TX, a reset transistor RES, an amplification transistor SF, and a selection transistor SEL. Control signals for controlling operations by the transfer transistor TX, the reset transistor RES, and the selection transistor SEL are supplied, for example, from the row selection circuit 102, and the control is conducted on each row at a time. With a signal PTX, when the transfer transistor TX is in a conductive state, charges accumulated in the photoelectric conversion unit PD are transferred to a node FD of a control electrode of the amplification transistor SF. The node FD is formed on a floating diffusion region when the pixels 101 are formed on a semiconductor substrate. Hereinafter, the node FD may also be referred to as FD unit. With a signal PRES, when the reset transistor RES is in the conductive state, the node FD is reset to a power supply voltage VDD. With a row selection pulse PSEL, when a row selection switch SEL is in the conductive state, an amplifier transistor constitutes a source follower circuit with a constant current source that is not illustrated in the drawing and outputs a signal in accordance with a potential at the node FD to the vertical signal line 103.

The signal processing circuit 200 is a circuit for processing the signal transmitted via the vertical signal line 103. Examples of a function provided to the signal processing circuit 200 include a noise reduction based on a CDS (Correlated Double Sampling), a signal amplification, and an A/D conversion. According to the present embodiment, the signal processing circuit 200 has at least a function of outputting an n-bit digital signal.

The memory group 300 temporarily holds the n-bit digital signal output from the signal processing circuit 200. The memory group 300 includes digital memories 301 that may hold at least n-bit digital signals on the respective columns. The plural (four in the present example) digital memories 301 commonly use a block digital output line 302 as a block wiring.

The digital memory 301 functioning as a memory unit adopts, for example, a configuration of an SRAM (Static Random Access Memory). The digital memory 301 is provided with an output impedance adjustment unit having an output impedance adjustment function. When a selection is made by a signal from the column selection circuit 600, the digital signal held in the digital memory 301 is output to the block digital output line 302. On the other hand, in a case where the selection is not made, the output is set as a high (H) impedance. As a specific configuration, for example, it is conceivable that the outputs of the respective digital memories 301 are provided with a switch.

The respective block digital output lines 302 are connected to input terminals of buffer circuits 401. According to this, the digital data that is output to the block digital output line 302 is transmitted to a subsequent stage by the buffer circuit 401. Similarly as in the digital memory 301, the buffer circuit 401 may also be provided with an output impedance adjustment unit.

The output of the buffer circuit 401 is connected to a block digital output line different from the block digital output line 302 to which the input is connected. The output of the buffer circuit 401 provided on the leftmost position of FIG. 1 is connected to the output unit 500. The digital signal that is input to the output unit 500 is output from an output terminal 501. The output unit 500 includes a parallel/serial conversion function (hereinafter, which will be referred to as P/S conversion function) and is configured to convert n-bit parallel data into serial data to be output from the output terminal 501. The signal to be output is a differential output based on an LVDS (Low Voltage Differential Signaling) system or the like.

It is noted that to simplify the drawing, the block digital output line 302 is drawn by a single line, and the buffer circuit 401 is also illustrated as one circuit. However, in actuality, to make it possible to transmit the n-bit digital signal, n pieces of wirings are prepared, and buffer circuits are provided in parallel on the respective wirings.

In FIG. 1, the four digital memories 301 are set as the memory group 300 for the one block, but the number of the digital memories 301 per block is not limited to 4.

It is conceivable that from the following reason, for example, the number S of the digital memories 301 included in the memory group 300 is determined on the basis of a parasitic load by the wiring of the block digital output line 302 and an element to be connected. This will be described by using FIG. 3.

Figure 3:
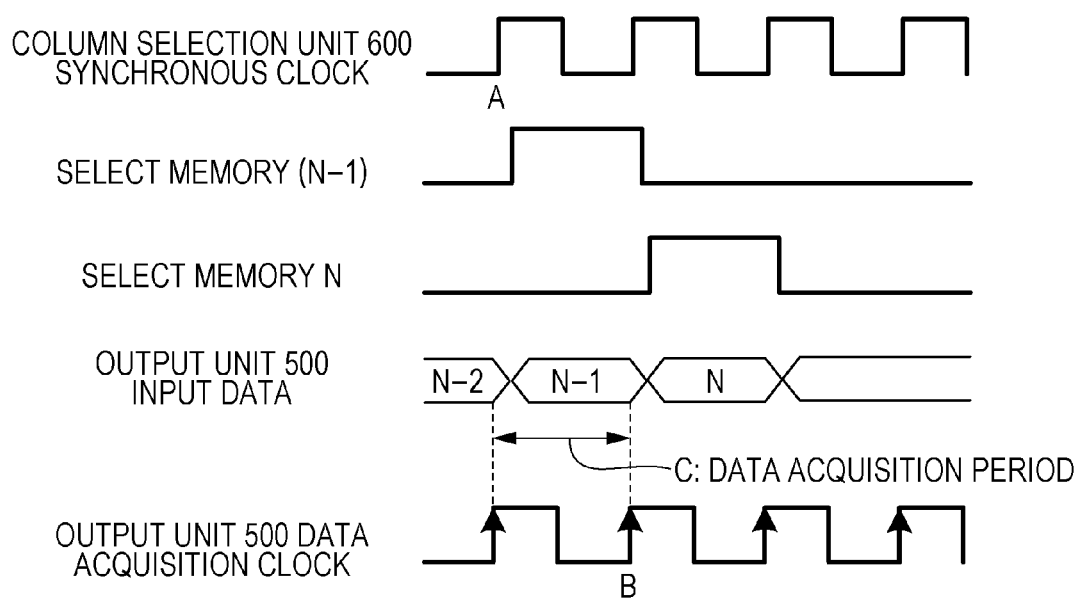
FIG. 3 illustrates a signal phase according to the first embodiment.

In FIG. 1, a consideration will be given of a block associated with the buffer circuit 401 that is connected to the output unit. FIG. 3 illustrates a synchronous clock output from the column selection circuit 600, signals for selecting the (N−1)-th digital memory and the N-th digital memory included in the memory group 300 corresponding to the column selection circuit 600, data to be input to the output unit 500, and further, a data acquisition clock for regulating a timing for sampling the data that is input to the output unit 500.

A synchronous clock for the column selection circuit 600 rises at a time A. In retard of the rise of the synchronous clock, when the (N−1)-th digital memory 301 is selected by the column selection circuit 600, the digital signal held in the digital memory 301 is output to the block digital output line 302. The buffer circuit 401 transmits the digital signal appearing on the block digital output line 302 to the output unit 500.

The output unit 500 acquires data on the digital signal output from the output unit 500 in synchronization with the data acquisition clock at a time B. In FIG. 3, at the time B, since the data input to the output unit 500 is shifted from the (N−1)-th digital memory 301 to the N-th digital memory 301, the value of the digital signal from the (N−1)-th digital memory 301 may not be acquired in some cases.

In this manner, as a factor for the acquisition at a timing when the value of the digital signal acquired by the output unit 500 is not yet confirmed, a parasitic load by a wiring existing on a transfer path for data or a parasitic load by an element connected to the transfer path is exemplified. In view of the above, the number S of the digital memories 301 connected to the block digital output line 302 may be designed while taking a delay amount into account.

According to the present embodiment, the plural digital signal output units arranged in parallel are set as the one block, and the block digital output line and the buffer circuit are commonly provided for this block. This block is provided in plural positions, and the output of the buffer circuit in one block is set to be supplied to the block digital output line in another block. According to this, a wiring connecting between selection circuits which is provided in related art may be omitted.

According to this configuration, the load through the drive of the buffer circuit is reduced, and while the signal delay is suppressed, it is further also possible to decrease the layout area.

Next, as an example of the operation by the photoelectric conversion apparatus illustrated in FIG. 1, thinned-out reading will be described. Herein, it is assumed that the column selection circuit 600 is composed of a shift register that may perform not only progressive scanning but also skip scanning or a decoder.

The control unit 700 supplies a signal for switching an operation mode to the column selection circuit 600 and selectively executes plural operation modes such as thinned-out reading for reading out a signal only from a part of a region in a part of the pixel array and cutout reading in addition to the progressive scanning on all the pixels.

An operation will be described by using FIGS. 4A, 4B, and 4C. It is assumed that the four digital memories 301 included in the unit of the memory group 300 are digital memories a to d for four columns.

Figure 4A:
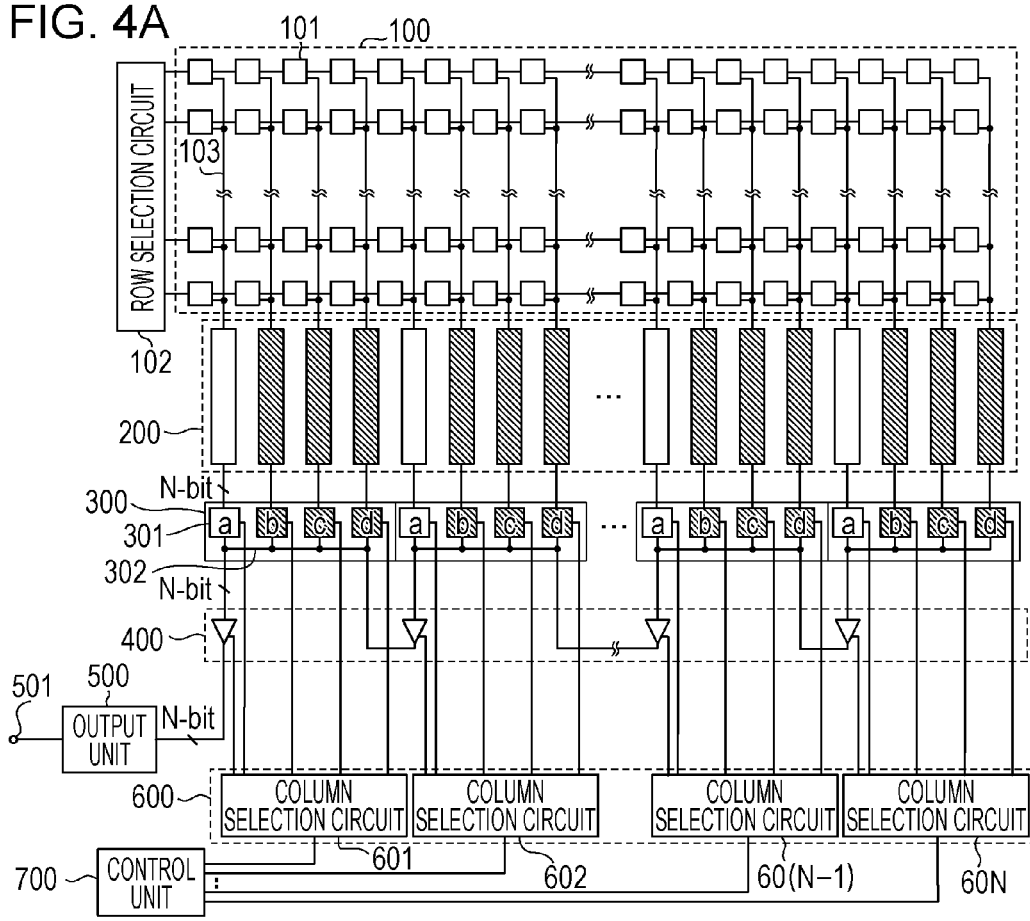
FIGS. 4A, 4B, and 4C are a block diagram of a configuration of the photoelectric conversion apparatus according to the first embodiment and timing charts.

FIG. 4A is the same as the photoelectric conversion apparatus 1 illustrated in FIG. 1. Herein, a consideration is given of a case in which a ¼ horizontally thinned-out operation of reading the digital signal from only one column per four columns of the pixel array is carried out, and the digital memories 301 where the digital signals are not read are hatched.

Figure 4B:
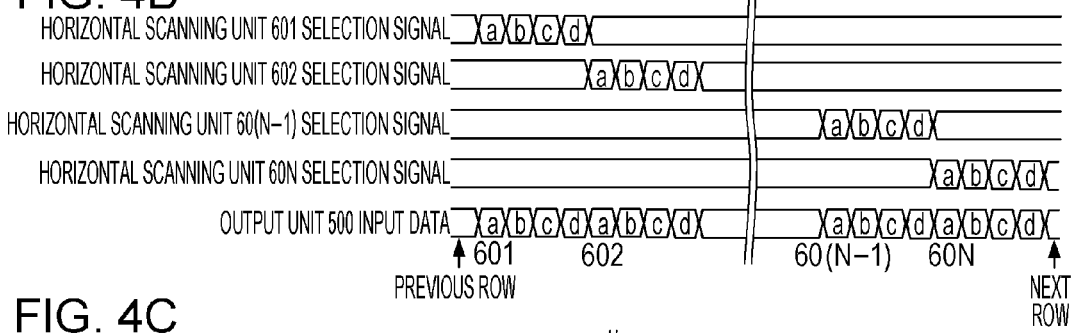

FIG. 4B illustrates signals output from the column selection circuits in a case where the signals are read out from the digital memories 301 on all the columns. To be more specific, FIG. 4B is a timing chart illustrating the columns of the digital memories selected by respective column selection circuits 601, 602, . . . , 60(N−1), and 60N illustrated in FIG. 1 and a data string input to the output unit 500.

The column selection circuit 601 selects a to d of the digital memories 301 in synchronization with the clock supplied from the control unit 700. Upon the selection by the column selection circuit 601, the digital signal output from the digital memory 301 is input to the output unit 500 with a delay by a delay time due to the load on the path including the buffer circuit 401.

When it is completed that all the digital memories of the corresponding block are selected by the column selection circuit 601, subsequently, the selection of the digital memory 301 by the column selection circuit 602 is started. Similarly, after this, the scanning of the digital memory 301 is conducted, and the digital signals on all the columns are output from the output unit 500. In parallel with the scanning of the digital memory by the column selection circuit, by conducting the A/D conversion on the pixel on the next row, it is possible to shorten a time spanning from the end of the output of the digital signal on a certain row until the output of the digital signal on the next row.

Figure 4C:
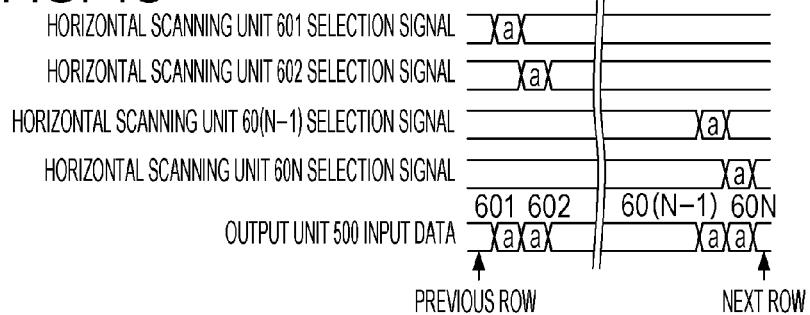

FIG. 4C is a timing chart illustrating an operation in a case where the signal is read out from only the digital memory that is not hatched in FIG. 4A. Since the respective column selection circuits selects the digital memories among the corresponding digital memories 301, as illustrated in FIG. 4C, the output unit 500 is only supplied with the digital signals from the digital memories of the respective blocks.

Furthermore, another reading system will be described. In FIGS. 4A and 4C, the horizontally thinned-out reading has been described in which the columns in an image pickup region are periodically sampled. Herein, a case of cutout reading will be described in which only signals on a part of continuous columns are read out. In this case also, the column selection circuit may be composed of a shift register that may perform the skip scanning or a decoder.

Figure 5A:
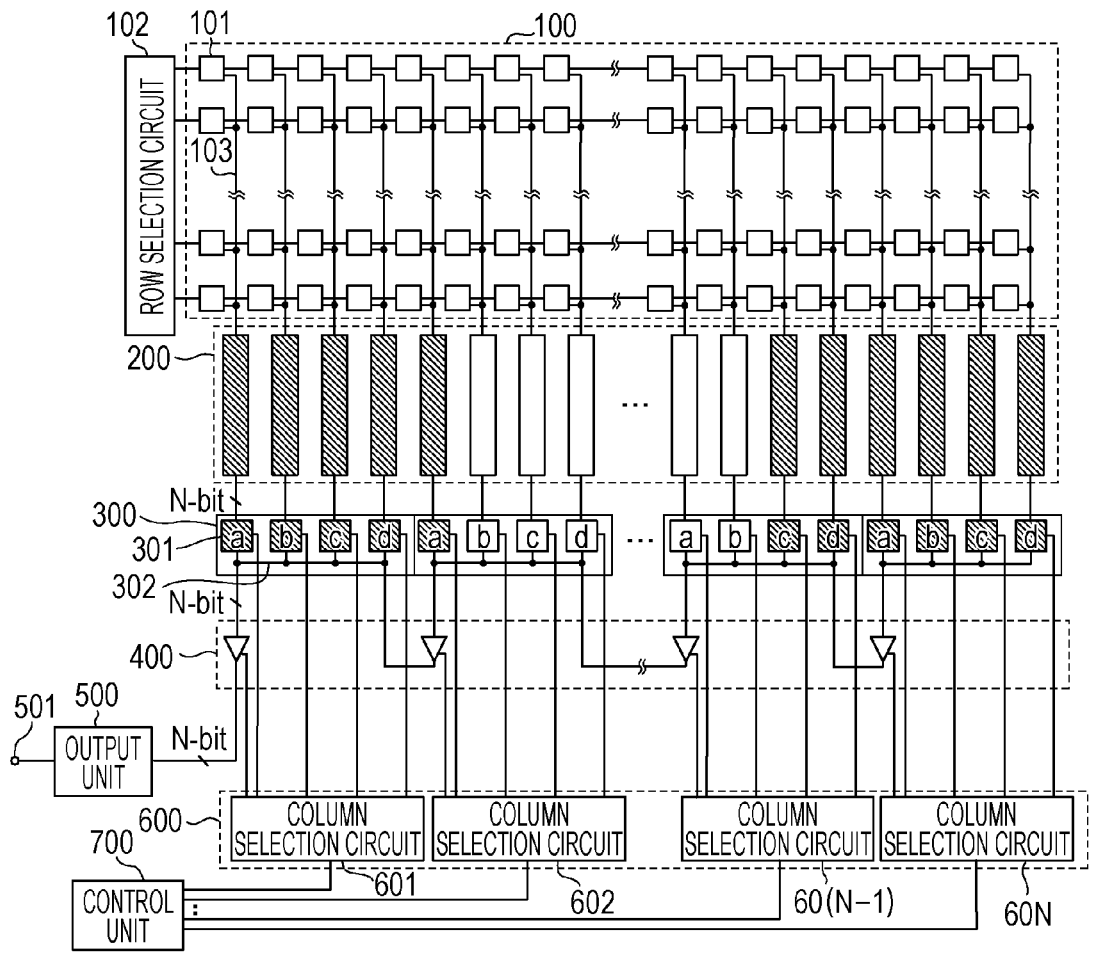
FIGS. 5A and 5B are a block diagram of a configuration of the photoelectric conversion apparatus according to the first embodiment and a timing chart.

In FIG. 5A, the digital signals are not output from the columns of the hatched signal processing unit 200 and the hatched digital memory 301 to the output unit. In FIG. 5A, the signals are not read out from the digital memories 301 corresponding to the column selection circuits 601 and 60N, and the digital signals are read out from a part of the digital memories provided so as to correspond to the column selection circuits 602 and 60(N−1) and the digital memories provided so as to correspond to the column selection circuits 603 to 60(N−2). A timing chart for the case of conducting the operation of the cutout reading illustrated in FIG. 5B illustrates this situation.

Figure 5B:
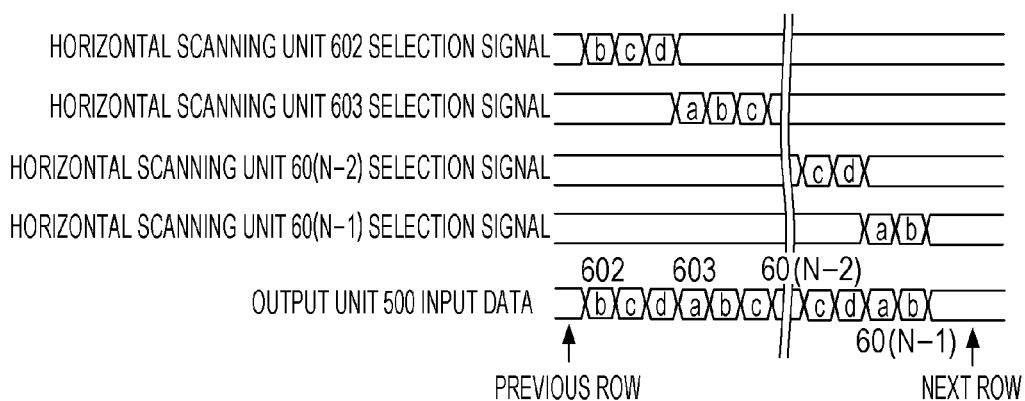

It is noted that the cutout reading illustrated in FIGS. 5A and 5B may also be combined with the thinned-out reading illustrated in FIGS. 4A and 4C.

Also, according to the example of the thinned-out reading and the cutout reading described above, the direction along the column is not explained, but the selection while thinning out the row of the pixel array 100 or the selection of only a part of continuous rows may be conducted by the row selection circuit 102.

According to the present embodiment described above, plural pairs including the plural digital signal output units, the block wiring, and the buffer circuit are provided, and the output of the buffer circuit is supplied to the block wiring of another pair, so that it is possible to realize the higher speed of the signal output while the increase in the area is suppressed.

Second Embodiment

Another embodiment will be described. According to the first embodiment, the example has been described in which the digital signal output units are provided in the respective columns of the pixel array, but the photoelectric conversion apparatus according to the present embodiment is provided with the digital signal output units on the respective pixels.

FIG. 6 illustrates a configuration of the photoelectric conversion apparatus according to an embodiment. Herein, the configuration provided with a pixel array 1000 where pixels 1001 of M rows×N columns are arranged and digital signal output units on the respective pixels 1001 will be described as an example.

A photoelectric conversion apparatus 1' includes the pixel array 1000, a buffer circuit 111, a row selection unit 2000, digital memories 3000 and 3002, a digital data processing unit 3001, a column selection unit 4000, and output units 5000 and 6000.

Figure 7:
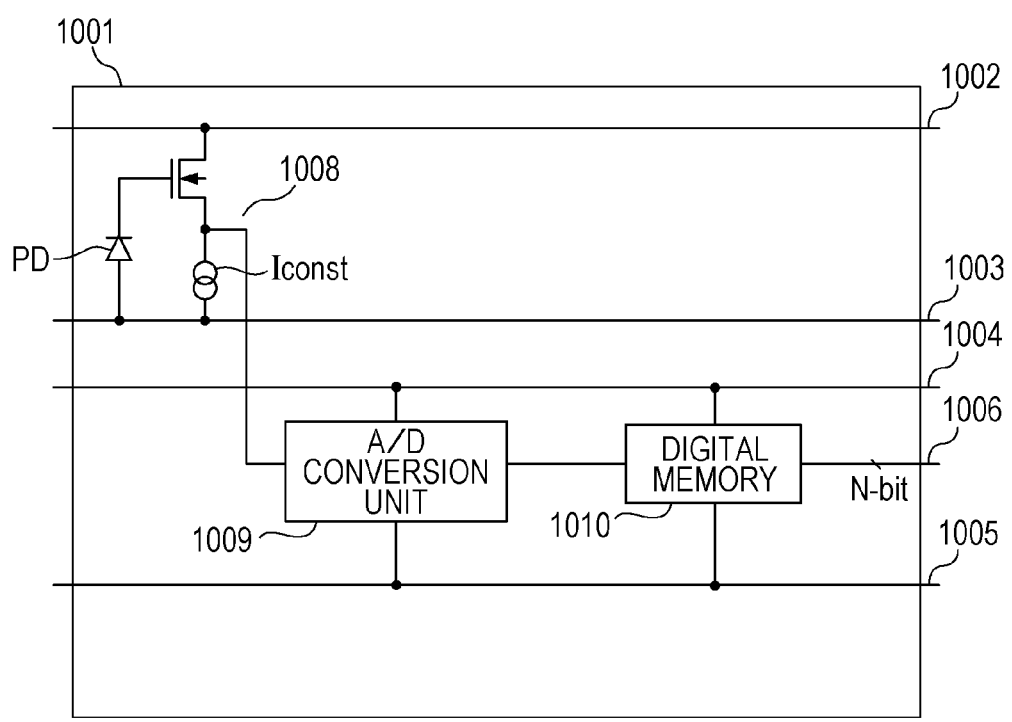
FIG. 7 is an equivalent circuit diagram of the pixel according to the second embodiment.

FIG. 7 is an equivalent circuit diagram of the pixel 1001. The pixel 1001 includes the photoelectric conversion unit PD and outputs a signal in accordance with the charge amount obtained through the photoelectric conversion from the pixel 1001 as the digital signal. The pixel 1001 includes an amplifier 1008, an A/D conversion unit 1009, and a digital memory 1010. In FIG. 7, power supply lines 1002 and 1004 supply power, and grounding wires 1003 and 1005 supply a ground voltage. By providing a capacitor element between the power supply line 1002 and the grounding wire 1003 as well as a capacitor element between the power supply line 1004 and the grounding wire 1005, it is possible to suppress an influence on an image quality caused by a power supply variation.

The amplifier 1008 includes a source follower circuit composed of the amplification transistor SF and a current source Iconst. When the photoelectric conversion unit PD accumulates the charges on the basis of incident light, a gate potential at the amplification transistor SF fluctuates, and an output of the amplifier 1008 also changes.

The signal that is output from the amplifier 1008 is converted into n-bit digital data by the A/D conversion unit 1009 to be held in the digital memory 1010. The digital memory 1010 adopts, for example, an SRAM configuration.

Since the digital memories 1010 are provided in the respective pixels, it may be mentioned that the plural digital output units are provided in parallel with respect to a block digital output line 1006.

It suffices if the pixel 1001 may output the digital signal, and the pixel 1001 may include a noise reduction function based on the CDS.

The row selection unit 2000 is configured to control the operation by the pixel 1001 in unit of row and control a photoelectric conversion operation, an amplification operation, an A/D conversion operation, a memory operation of digital data, a read operation of the memory data, and the like by the pixel 1001. In FIG. 6, a control signal line connecting the row selection unit 2000 with the respective pixels 1001 is represented by a single line to simplify the drawing.

The digital memory 1010 selected by the row selection unit 2000 outputs the stored data and the n-bit digital signal to the block digital output line 1006. According to one embodiment, the block digital output line 1006 is provided every four rows for the respective columns. For the respective block digital output lines 1006, one buffer circuit 111 is provided. In other words, the plural block digital output lines 1006 are connected in series by the buffer circuits.

The digital memory 1010 and the buffer circuit 111 according to one embodiment may be provided with a function of adjusting the impedance of the output. According to this, the digital memory 1010 and the buffer circuit 111 other than those selected by the row selection unit 2000 may be controlled so that the output may be set in the high impedance state by the row selection unit 2000.

The digital signal output from the pixel 1001 selected by the row selection unit 2000 is transmitted to the digital memory 3000 on the corresponding columns via the block digital output line 1006 and the buffer circuit 111. When the digital signal held in the digital memory 3000 is selected by the column selection unit 4000, the digital signal is processed in the digital data processing unit 3001 and transferred to the corresponding digital memory 3002 or output unit 6000.

When the digital memory 3002 is selected by the column selection unit 4000, the digital memory 3002 outputs the held digital signal.

The output unit 5000 includes a parallel-serial conversion function and converts n-bit parallel data into serial data to be output from the output terminal 501. The signal to be output is a differential output based on the LVDS system or the like.

Since the output units 6000 are provided so as to correspond to the respective digital memories 3000, it is possible to output the digital signals corresponding to the pixels on the plural columns in parallel. On the other hand, the output unit 5000 may output the signals output from the digital memory 3002 in series. The digital signal output from the digital data processing unit 3001 may be output to one of the digital memory 3000 and the output unit 6000 or output to the both at the same time. In a case where the digital signals are output in parallel by the output units 6000, the number of the output units 6000 operating at the same time is greater than a case where the digital signals are output serially by the output unit 5000. Thus, the power consumption is increased more than the case of the output from the output unit 5000, but an advantage is attained that the output may be conducted at a higher speed. For example, it is conceivable that the output units 6000 are used for a use where the signal output at a high frame rate such as moving images is to be used, and the output unit 5000 is used for a use where the signal output at a lower speed may be accepted such as still images.

The digital data processing unit 3001 is provided, for example, with a function of conducting a computation processing such as a data correction or a digital amplification and is controlled by the column selection unit 4000. It is however noted that the digital data processing unit 3001 may have a configuration of only buffering the digital signal output from the buffer circuit 111.

In FIG. 6, to simplify the drawing, the control signal line from the column selection unit 4000 to the digital memories 3000 and 3002, the digital data processing unit 3001 and the block digital output line 1006 are respectively represented by the single lines.

Also, although not illustrated in the drawing, the pixel 1001 may be provided with a function of performing the P/S conversion on the data of the digital memory 1010, and the data may be transformed as the serial data from the pixel 1001 to the digital memory 3001 and transformed as the parallel data from the digital memory 3002 to the output unit 5000.

Next, an operation according to the present embodiment will be described. FIG. 8A illustrates an operation sequence example in a case where the digital signal is output from the output unit 5000.

First, the pixel performs an operation of accumulating charges (accumulation period) and thereafter an operation of performing an A/D conversion on a signal based on the obtained charges (A/D conversion period). The operations in the charge period and the A/D conversion period are carried out at the same time with regard to all the pixels of the pixel array.

Next, in a vertical read period, the digital signal is output from the pixel on the first row and held in the digital memory 3000.

After that, in a row data computation processing period, the digital data processing unit 3001 performs a signal processing, and the result is held in the digital memory 3002.

The data held in the digital memory 3002 is output to the output unit 5000 during the horizontal read period.

Herein, by carrying out the operation in the vertical read period with regard to another row in parallel with the operation in the horizontal read period on a certain row, a higher speed of the reading of the digital signal is realized. In this manner, the operations of conducting the horizontal reading and the vertical reading in parallel may be realized with the configuration in which the digital memories 3000 and 3002 are provided so that input and output of the data may be conducted at the same time.

In the vertical read period, the parallel n-bit data is transferred for one pixel. In contrast, in the horizontal read period, the parallel n-bit data is transferred for the number of columns. Thus, the horizontal read period is longer. Therefore, in the horizontal read period, not only the operation in the vertical transfer period on another row but also the computation processing by the digital data processing unit 3001 may be executed.

Next, FIG. 8B illustrates an operation sequence example in the case of reading out the signals from the output unit 6000. In FIG. 8B, the row data computation processing period is not illustrated.

In FIG. 8B also, similarly as in the operation illustrated in FIG. 8A, the operations in the charge period and the A/D conversion period are carried out at the same time with regard to all the pixels.

A difference from the operation of FIG. 8A resides in that since the signal is output from the output unit 6000, the horizontal read period is not provided.

Next, FIG. 8C illustrates another operation sequence example in the case of reading out the signal from the output unit 5000.

In FIG. 8A, the operations in the charge period and the A/D conversion period are conducted at the same time for all the pixels, but in an operation of FIG. 8C, a difference resides in that the operations in the charge period and the A/D conversion period are conducted at different timings for each row.

FIG. 8D illustrates another operation sequence example in the case of reading out the signal from the output unit 6000.

In FIG. 8B, the operations in the charge period and the A/D conversion period are conducted at the same time for all the pixels, but in an operation of FIG. 8D, a difference resides in that the operations in the charge period and the A/D conversion period are conducted at different timings for each row.

For example, it is conceivable that the still image is obtained through the operation illustrated in FIGS. 8A and 8B and the moving image is obtained through the operation illustrated in FIGS. 8C and 8D.

The photoelectric conversion apparatus according to the present embodiment may execute not only the operations described with reference to FIGS. 8A to 8D above but also the thinned-out reading and the cutoff reading described according to the first embodiment.

Also, according to one embodiment, the case in which the data for one row are held by the digital memories 3000 and 3002, respectively has been exemplified, but by allowing the respective digital memories 3000 and 3002 to hold the data for plural rows, it is possible to realize the further higher speed by transferring the data on the plural rows to the output unit 5000 at the same time.

According to one embodiment, similarly as in the first embodiment, plural pairs including the plural digital signal output units, the block wiring, and the buffer circuit are provided, and the output of the buffer circuit is supplied to the block wiring of another pair, so that it is possible to realize the higher speed of the signal output while the increase in the area is suppressed.

Third Embodiment

Another embodiment will be described.

Figure 9:
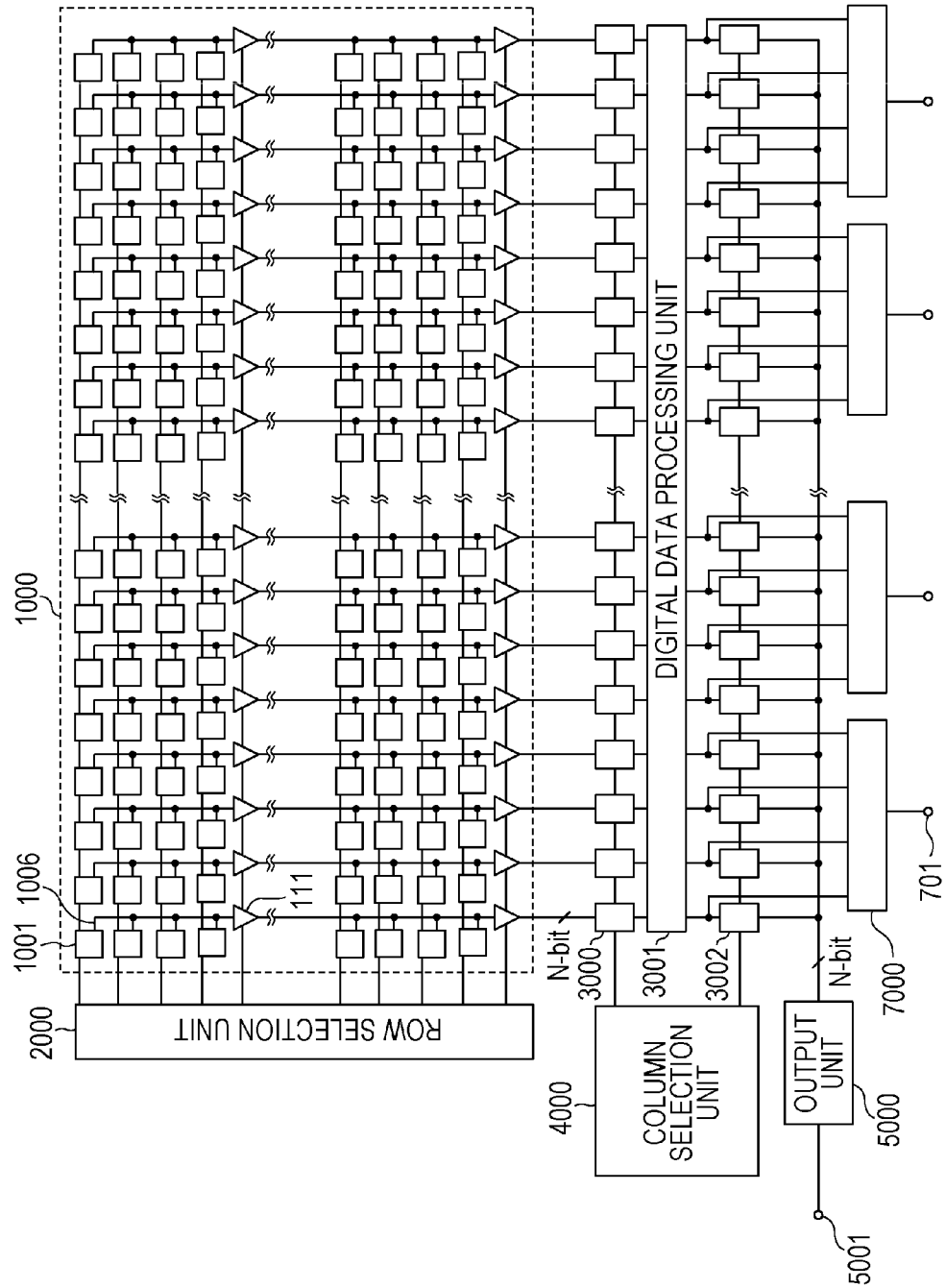
FIG. 9 is a block diagram of a configuration of the photoelectric conversion apparatus according to a third embodiment.

FIG. 9 is a block diagram of a configuration of the photoelectric conversion apparatus according to one embodiment. Similarly as in the photoelectric conversion apparatus 1' described according to the second embodiment, the respective pixels of the pixel array are provided with the digital signal output units. Configurations common to the photoelectric conversion apparatus 1' are assigned with the same reference symbols, and a different point will be described hereinafter.

According to the second embodiment, the output units 6000 are provided so as to correspond to the respective digital memories 3002, but a difference resides in that the photoelectric conversion apparatus according to one embodiment is provided with an output unit 5000 provided commonly to the plural digital memories 3002. FIG. 9 illustrates a configuration in which the output unit 7000 is shared by the digital memories 3002 on the adjacent four columns.

By adjusting a transfer rate of the output unit 7000, it is possible to realize the data transfer at a speed equivalent to the configuration illustrated in FIG. 6. For example, a PLL (Phase Locked Loop) circuit may be provided in the output unit 7000, and a drive signal is generated through a quad edge evaluation of a drive signal for deciding a transfer rate of the output unit 5000 by the PLL circuit. The digital signal may be output from the output unit 7000 in synchronization with this drive signal subjected to the quad edge evaluation.

According to one embodiment, an advantage is attained that even when the number of pixels is increased, the increase in the number of output terminals of the output unit may be suppressed, and a flexible design may be realized in accordance with a layout, a mounting package, a specification on a system side where the digital data is received, or the like.

Fourth Embodiment

Another embodiment will be described.

Figure 10:
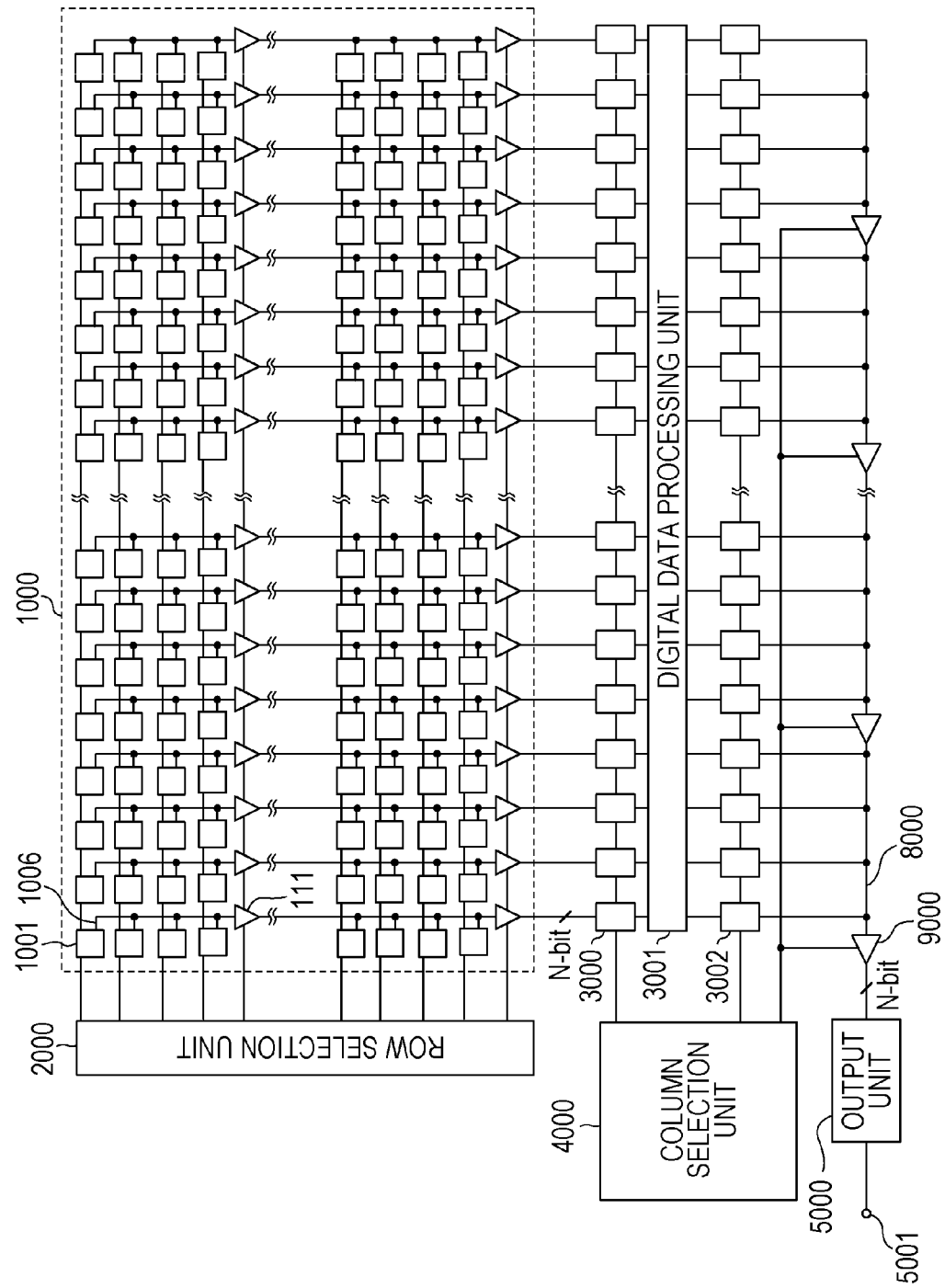
FIG. 10 is a block diagram of a configuration of the photoelectric conversion apparatus according to a fourth embodiment.

FIG. 10 is a block diagram of a configuration of the photoelectric conversion apparatus.

A difference from the third embodiment resides in that in the photoelectric conversion apparatus according to the present embodiment, the respective pixels 101 are provided with the digital signal output units, a block digital output line 1006 and a buffer circuit 111 are provided every four rows, and in addition, a block digital output line 8000 and a buffer circuit 9000 are provided similarly as in the transfer path from the digital memories 3002 to the output unit 500. To elaborate, while the digital memories 3002 are set as the digital signal output unit, and the block digital output line and the buffer circuit are provided to the plural digital signal output units.

According to one embodiment also, the digital memory 3002 and the buffer circuit 9000 may be provided with a function of adjusting the output impedance.

Also, to simplify the drawing, the output unit 6000 and the output unit 7000 according to the third embodiment are not illustrated, but according to one embodiment also, the second output unit 6000 and the output unit 7000 may be provided.

Fifth Embodiment

Another embodiment will be described.

Figure 11:
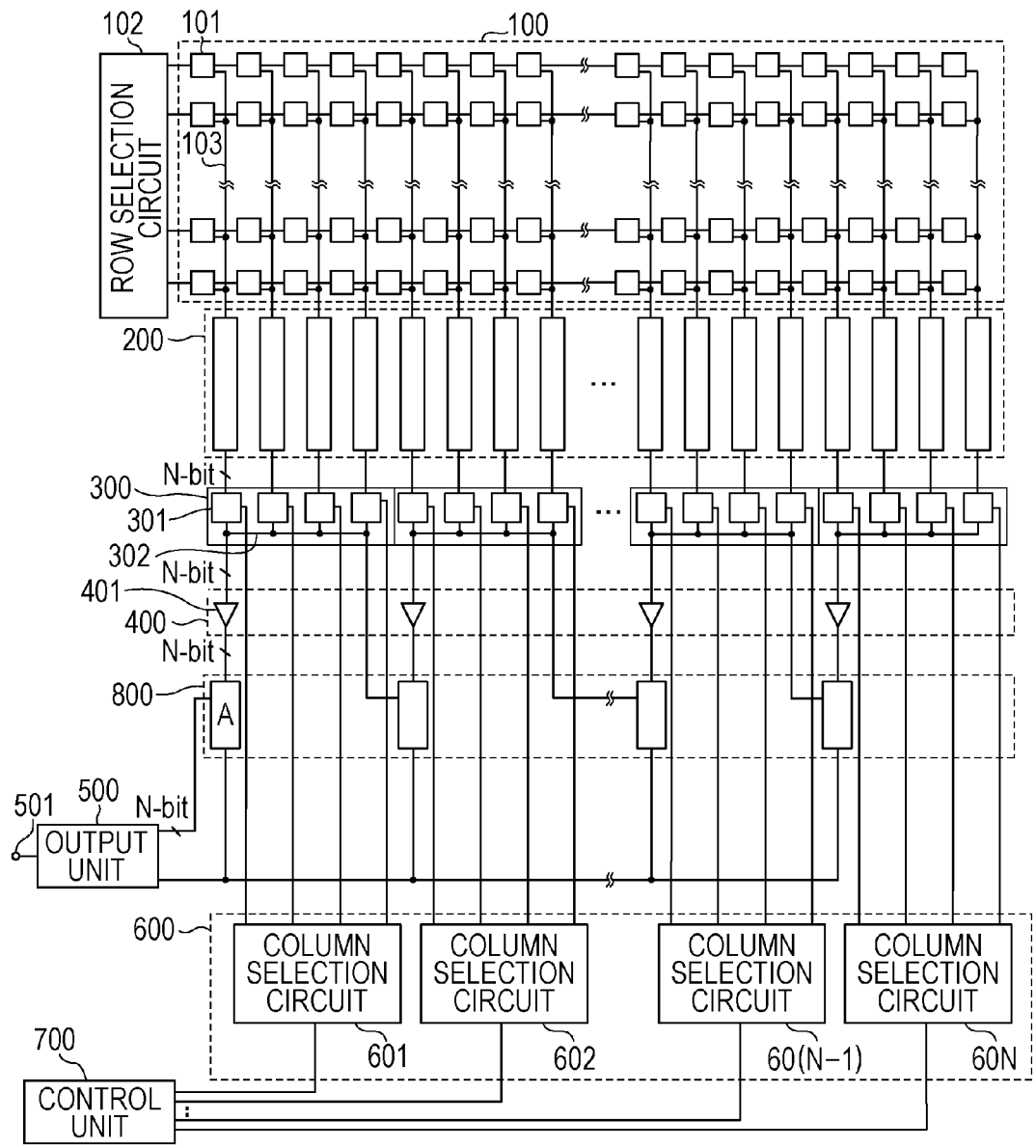
FIG. 11 is a block diagram of a configuration of the photoelectric conversion apparatus according to a fifth embodiment.

FIG. 11 is a block diagram of a configuration of the photoelectric conversion apparatus according to the present embodiment. Similarly as in the photoelectric conversion apparatus 1 illustrated in FIG. 1, the respective columns of the pixel array are provided with the digital signal output units. Configurations common to FIG. 1 are assigned with the same reference symbols, and a different point will be described hereinafter.

According to one embodiment, the output of the buffer circuit 401 is not connected to the other block digital output line 302, but a difference from the first embodiment resides in that the output of the buffer circuit 401 is connected via a synchronization circuit 800 to the other block digital output line 302.

The synchronization circuit 800 operates in synchronization with a data acquisition clock signal supplied from a control unit that is not illustrated in the drawing and supplied also to the output unit 500. By synchronizing the transmission of the digital signal with the data acquisition clock signal of the output unit 500, even in a case where the speed of the transfer is increased, it is possible to suppress a data transfer error between the buffer circuits 401 or a data acquisition error in the output unit 500. According to this, the high speed data transfer may be realized.

The output of the synchronization circuit 800 is provided with the function of adjusting the output impedance similarly as in the buffer circuit 401 according to the first embodiment. In a case where the digital signal is not transmitted to a subsequent stage, the output impedance of the synchronization circuit 800 may be raised.

The synchronization circuit 800 may be composed, for example, of a delay flip-flop. An operation in this case is illustrated in FIG. 12.

Figure 12:
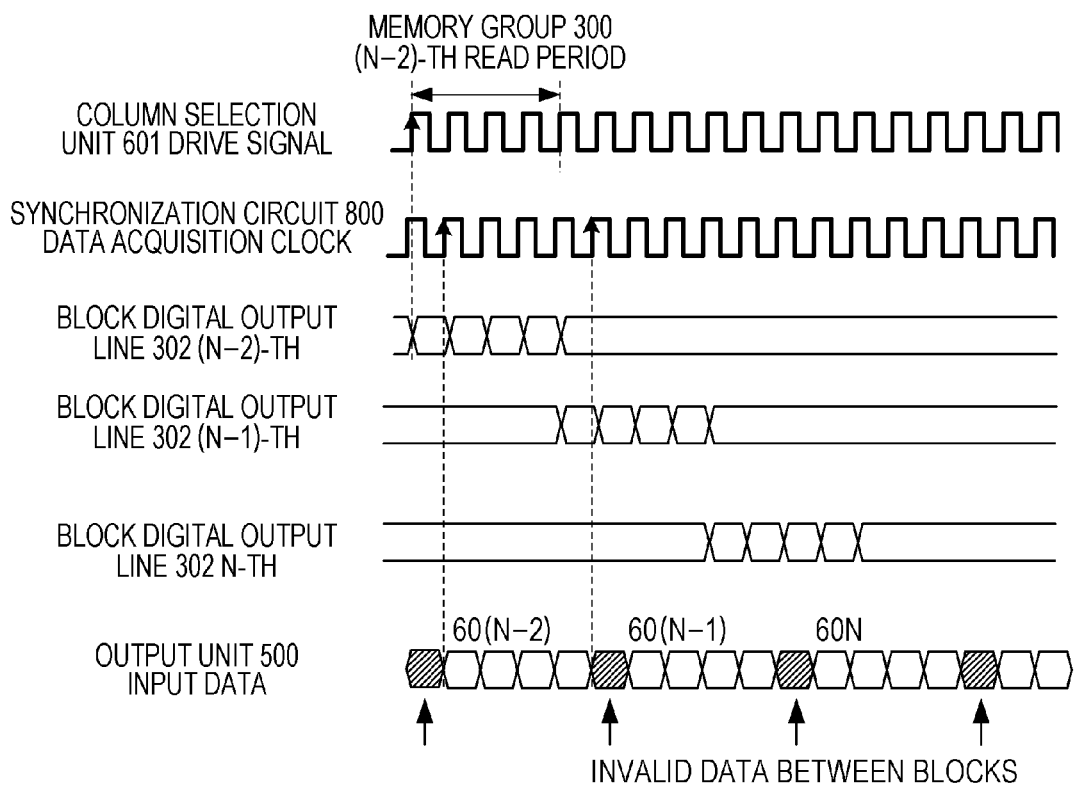
FIG. 12 is a timing chart of an operation according to the fifth embodiment.

FIG. 12 illustrates signals output from the column selection circuit in a case where the signals are read out from the digital memories 301 on all the columns. To be more specific, FIG. 12 is a timing chart illustrating the columns of the digital memories selected by the respective column selection circuits 601, 602, ..., 60(N−1), and 60N and a data string provided to the output unit 500. FIG. 12 corresponds to a case in which the digital signals are input from the (N−2)-th block, the (N−1)-th block, and the N-th block to the output unit 500.

FIG. 12 illustrates an input signal for the synchronization circuit 800 denoted by A in FIG. 11. In synchronization with the drive signal for driving the column selection circuit 601, the input signal is input to the synchronization circuit 800. As illustrated in FIG. 12, the transferred data has invalid data for one cycle of the data acquisition clock of the output unit 500 generated between the adjacent blocks.

With regard to the invalid data generated because of the provision of the synchronization circuit 800, for example, the output unit 500 may be provided with an adjustment function for the latency, and the data may also be output as continuous data including no invalid data from the output terminal 501.

It is noted that according to one embodiment, the buffer circuit 401 is explicitly separated from the synchronization circuit 800, but the function of the buffer circuit 401 may be incorporated in the synchronization circuit 800, and the buffer circuit 401 may also be omitted.

Sixth Embodiment

Another embodiment will be described.

Figure 13:
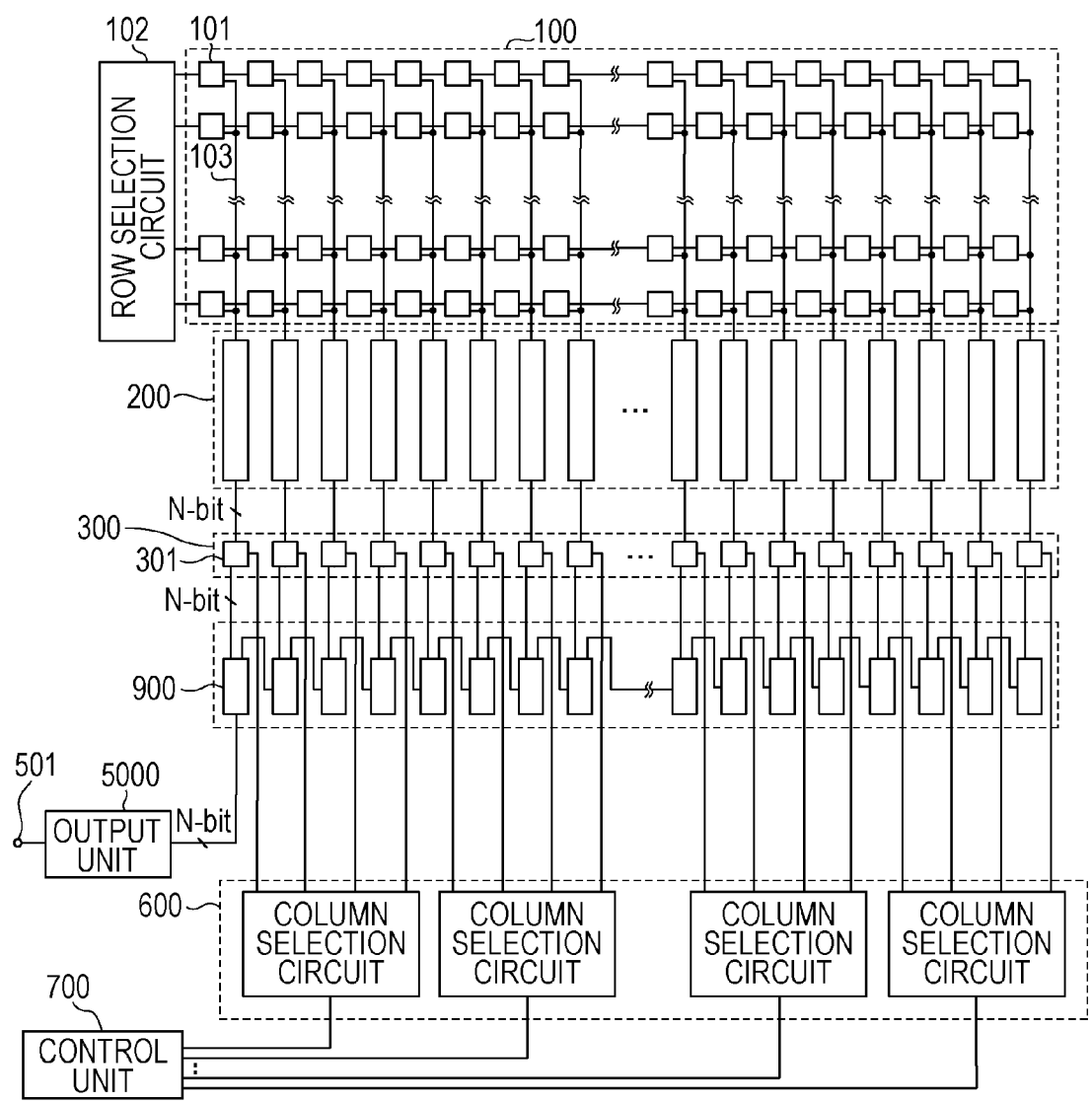
FIG. 13 is a block diagram of a configuration of the photoelectric conversion apparatus according to a sixth embodiment.

FIG. 13 is a block diagram of a configuration of the photoelectric conversion apparatus according to the present embodiment. Similarly as in the first embodiment, the signal processing units 200 provided so as to correspond to the respective columns of the pixel array 100 have an A/D conversion function.

According to one embodiment, the digital signals output from the digital memories 301 functioning as the digital signal output units are supplied to output selectors 900 provided so as to correspond to the digital memories 301.

The output of the digital memory 301 on the corresponding column and the output of the output selector 900 provided so as to correspond to the digital memory 301 on the adjacent column are input to the output selector 900, and the output selector 900 may selectively output one of the inputs. Which one of the inputs is to be output is switched by a control signal supplied from a control unit that is not illustrated in the drawing.

The output selector 900 may be configured by including, for example, an OR logic circuit. The output of the digital memory 301 and the output of the output selector 900 on the adjacent column are input to the output selector 900. The output selector 900 may transmit the OR logic between both the inputs to the output selector 900 in the next stage.

To avoid an indefinite output of the output selector 900 at an end part among the plural output selectors 900 connected in series, with regard to the end part, the OR logic between the output of the digital signal output unit and a ground voltage GND is adopted.

When the digital memory 301 functioning as the digital signal output unit is selected by the column selection unit 600, the digital memory 301 outputs the held digital signal. In a case where the digital memory 301 is not selected, the digital memory 301 outputs the GND level. With this configuration, the result of the OR logic of the output selector 900 is determined on the basis of the digital signal output from the selected digital memory 301, and the data may be transferred to the output selector in the next stage.

According to one embodiment, since the output of the digital memory 301 is connected to the output selector 900 including the OR logic circuit, the impedance of the output may not be controlled.

With the configuration according to one embodiment, since the block digital output line 302 may be omitted, the layout area may further be reduced as compared with the first embodiment. Also, the wirings on which the respective output selectors are driven are relatively short wirings extending up to the output selector on the adjacent column. Thus, the parasitic load of the element connected to this wiring or the wiring may further be reduced, and the higher speed of the data transfer may be realized.

Seventh Embodiment

Another embodiment will be described.

Figure 14:
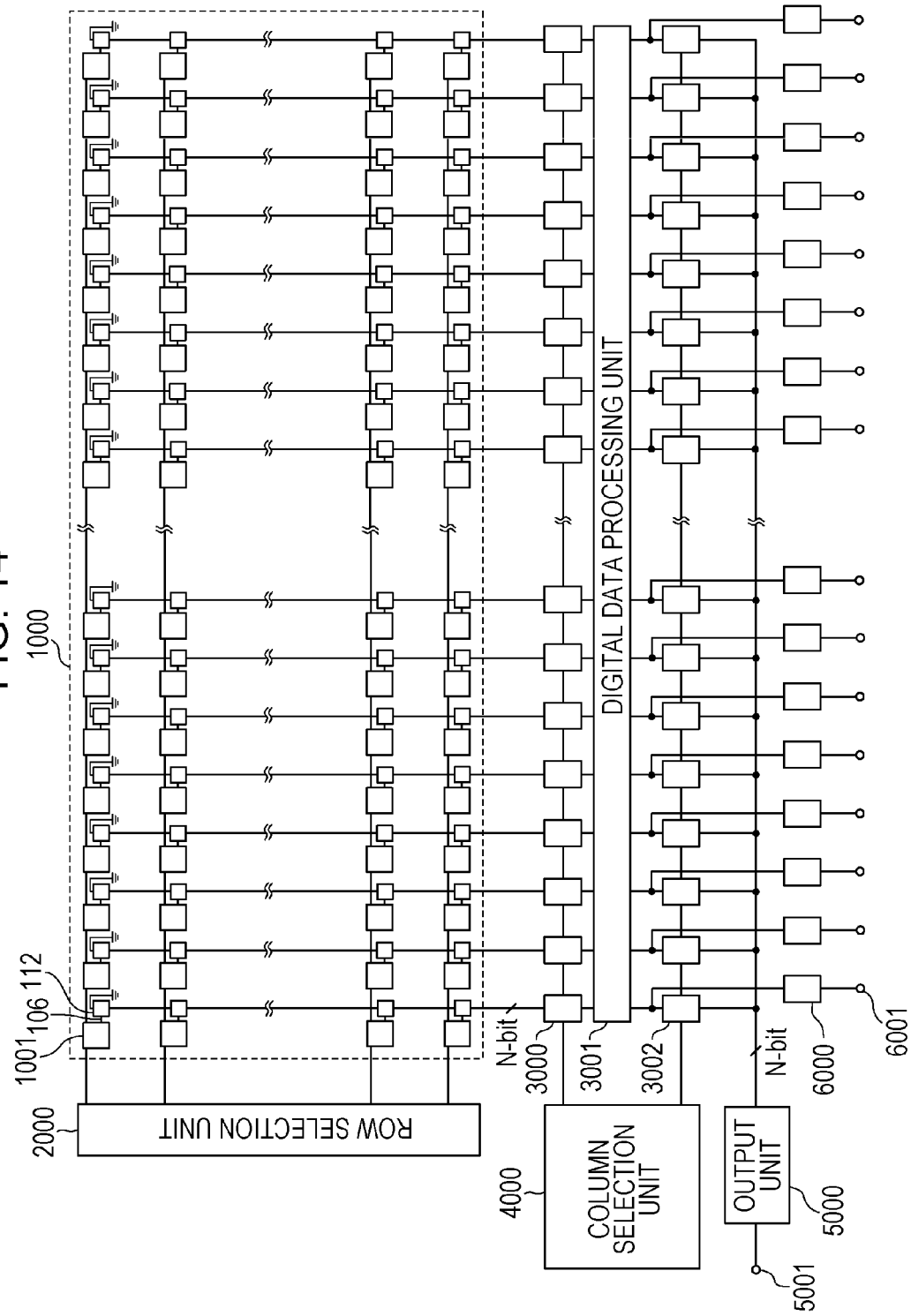
FIG. 14 is a block diagram of a configuration of the photoelectric conversion apparatus according to a seventh embodiment.

FIG. 14 illustrates a configuration of the photoelectric conversion apparatus according to one embodiment. In the configuration illustrated in the sixth embodiment, the output selectors 900 are provided on the respective columns of the pixel array 100, but according to one embodiment, a difference resides in that the respective pixels 1001 have the digital signal output units, and the output selectors are provided so as to correspond to the respective pixels.

Herein, the configuration has been illustrated in which the digital signal is transmitted via the common wiring from the digital memory 3002 to the output unit 5000, but the configuration according to the sixth embodiment illustrated in FIG. 13 may similarly be adopted.

Eighth Embodiment

Another embodiment will be described.

According to the sixth embodiment, only the output selectors 900 are connected in series while the output selector 900 is input to the other output selector 900, but the buffer circuit and the synchronization circuit may be provided between the output selectors.

Figure 15:
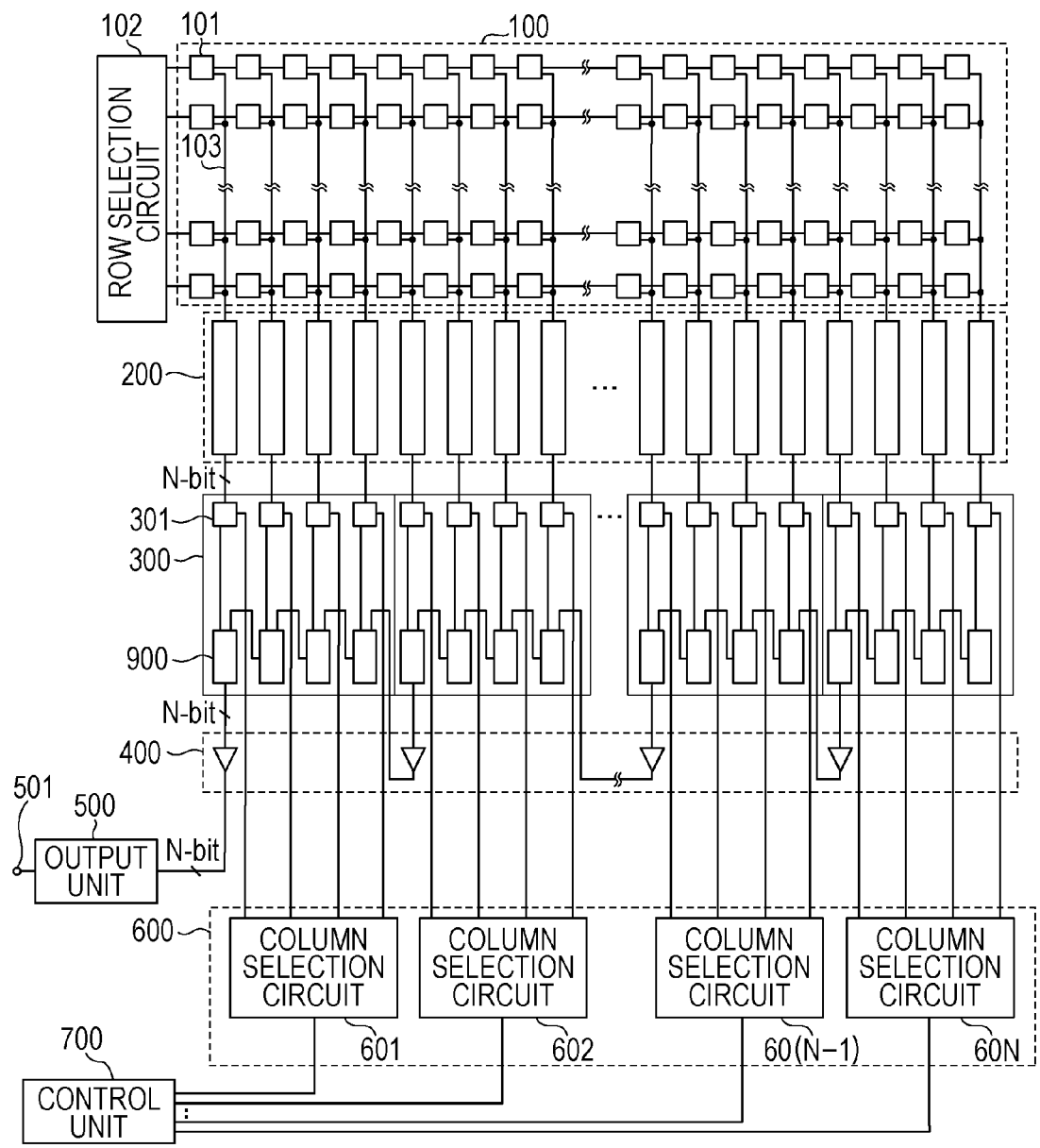
FIG. 15 is a block diagram of a configuration of the photoelectric conversion apparatus according to an eighth embodiment.

FIG. 15 illustrates a configuration in which the buffer circuit 401 is provided every four output selectors 900 illustrated in FIG. 13.

Figure 16:
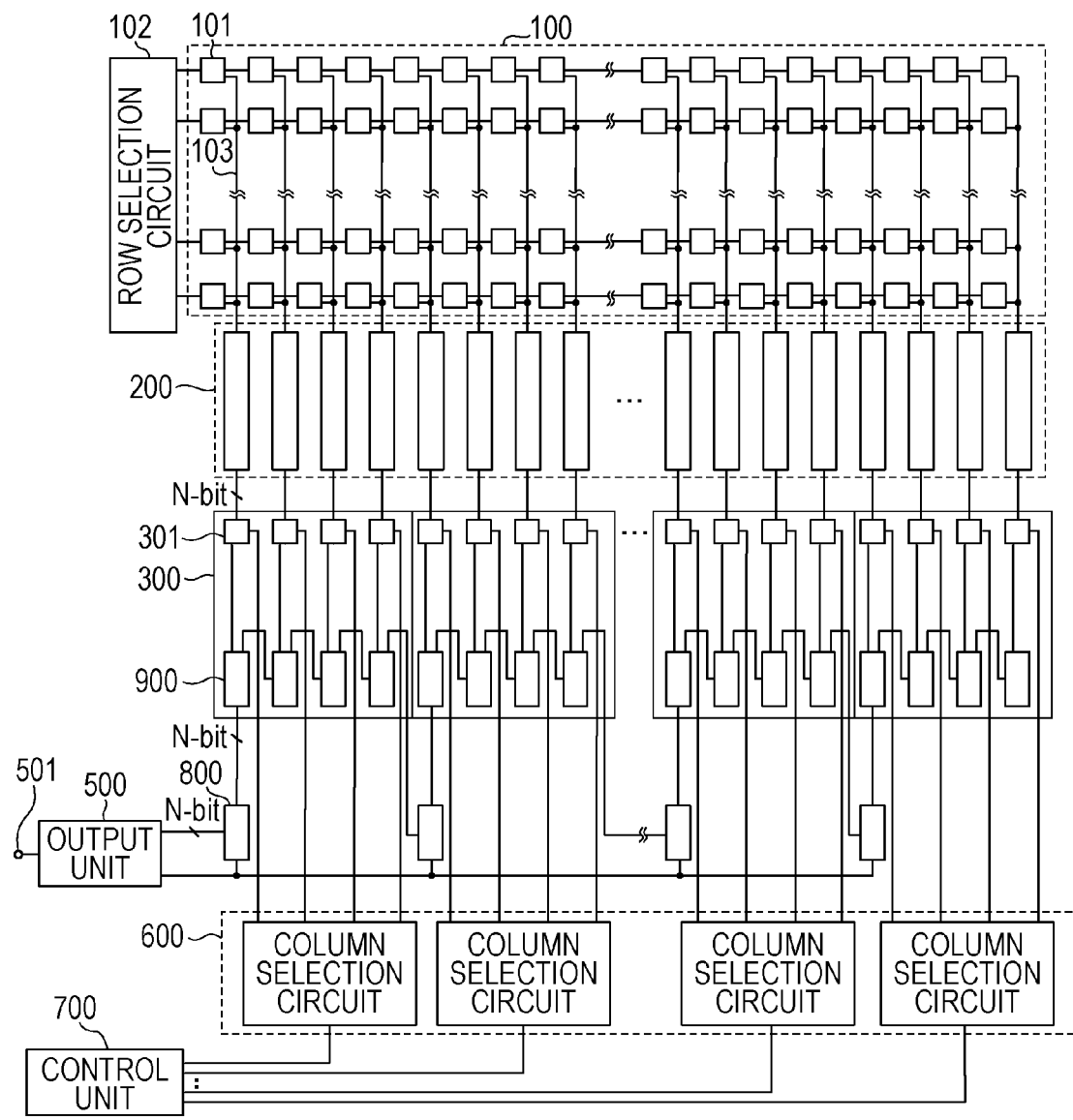
FIG. 16 is another block diagram of the configuration of the photoelectric conversion apparatus according to the eighth embodiment.

Also, FIG. 16 illustrates a configuration obtained by replacing the buffer circuit 401 with the synchronization circuit 800 in the configuration of FIG. 15.

In either of the configurations, by connecting the output selectors in series, the wiring on which the respective output selectors are driven is a relatively short wiring extending up to the output selector on the adjacent column. This, the parasitic load of the element connected to this wiring or the wiring may further be reduced, and the higher speed of the data transfer may be realized.

Ninth Embodiment

Figure 17:
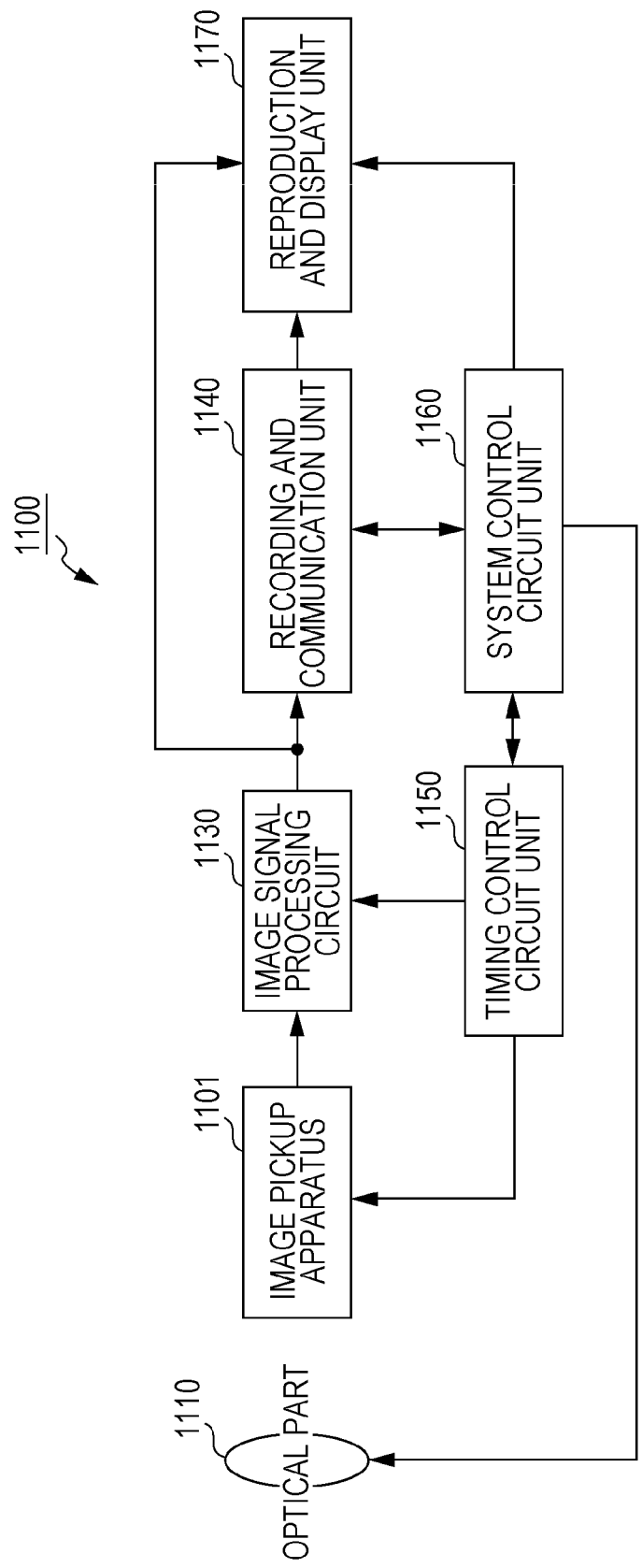
FIG. 17 is a block diagram of a configuration of an image pickup system according to a ninth embodiment.

Next, an outline of an image pickup system according to one embodiment will be described in FIG. 17.

An image pickup system 1100 includes, for example, an optical part 1110, an image pickup apparatus 1101, an image signal processing circuit unit 1130, a recording and communication unit 1140, a timing control circuit unit 1150, a system control circuit unit 1160, and a reproduction and display unit 1170. For the image pickup apparatus 1101, the photoelectric conversion apparatus described according to the respective above-described embodiments may be used.

The optical part 1110 functioning as an optical system such as a lens forms an image of light from a subject onto a pixel array of the image pickup apparatus 1101 where plural pixels are arranged two-dimensionally to form an image of the subject. The image pickup apparatus 1101 outputs a signal in accordance with light imaged on a pixel unit at a timing based on a signal from the timing control circuit unit 1150.

The signal that is output from the image pickup apparatus 1101 is input to the image signal processing circuit unit 1130 functioning as an image signal processing unit, and the image signal processing circuit unit 1130 performs a processing such as a correction on the input electric signal while following a method determined by a program or the like. The signal obtained through a processing in the image signal processing circuit unit is sent to the recording and communication unit 1140 as image data. The recording and communication unit 1140 sends the signal for forming an image to the reproduction and display unit 1170 to reproduce and display the moving image or the still image on the reproduction and display unit 1170. The recording and communication unit also receives the signal from the image signal processing circuit unit 1130 to perform a communication with the system control circuit unit 1160 as well and also performs an operation of recording the signal for forming the image in a recording medium that is not illustrated in the drawing.

The system control circuit unit 1160 is configured to control the operation of the image pickup system in an overall manner and control the drives of the optical part 1110, the timing control circuit unit 1150, the recording and communication unit 1140, and the reproduction and display unit 1170. Also, the system control circuit unit 1160 is provided, for example, with a storage medium that is not illustrated in the drawing which functions as a recording medium. A program or the like used for controlling the image pickup system is recorded in the storage medium. Also, the system control circuit unit 1160 supplies, for example, a signal for switching drive modes in accordance with an operation by a user in the image pickup system. As a specific example, the control includes a change of a row to be read or a row to be reset, a change of a field angle associated with an electronic zoom, a shift of the field angle associated with an electronic image stabilizing, and the like.

The timing control circuit unit 1150 is configured to control driving timings of the image pickup apparatus 1101 and the image signal processing circuit unit 1130 on the basis of a control by the system control circuit unit 1160 functioning as the control unit.

Others

The above-described respective embodiment have been explained while taking the photoelectric conversion apparatus as an example, but the disclosure is not limited to the photoelectric conversion apparatus and may be applied to a configuration in which the digital signal output units that output the digital signals are arranged in parallel.

While the disclosure has been described with reference to embodiments, it is to be understood that the disclosure is not limited to the disclosed embodiments. The scope of the following claims is to be accorded the broadest interpretation so as to encompass all such modifications and equivalent structures and functions as well as combinations of other embodiments.

This application claims the benefit of Japanese Patent Application No. 2012-050689 filed Mar. 7, 2012, which is hereby incorporated by reference herein in its entirety.

What is claimed is:

1. A signal transmission apparatus comprising:
    a plurality of digital signal output units including a plurality of first digital signal output units and a plurality of second digital signal output units, each of the plurality of digital signal output units configured to output a digital signal,
    first block wiring being connected to output terminals of the plurality of first digital signal output units, and second block wiring being connected to output terminals of the plurality of second digital signal output units, and
    first buffer circuit having first buffer input and first buffer output, and second buffer circuit having second buffer input and second buffer output, the first input being connected to the first block wiring, and the second buffer input being connected to the second block wiring,
    wherein the first buffer output is connected to the second buffer input via the second block wiring.

2. The signal transmission apparatus according to claim 1, wherein one of the first and second digital signal output units includes an analog-to-digital (A/D) conversion unit.

3. The signal transmission apparatus according to claim 2, wherein the one of the first and second digital signal output units includes a memory unit configured to hold the digital signal that is output from the A/D conversion unit.

4. The signal transmission apparatus according to claim 3, wherein the memory unit includes an output impedance adjustment unit configured to adjust an output impedance of the memory unit.

5. The signal transmission apparatus according to claim 1, wherein one of the first and second buffer circuits includes an output impedance adjustment unit configured to adjust an output impedance of the one of the first and second buffer circuits.

6. The signal transmission apparatus according to claim 1, wherein one of the first and second buffer circuits outputs the digital signal in synchronization with a clock signal.

7. A photoelectric conversion apparatus comprising:
    the signal transmission apparatus according to claim 1; and
    a plurality of pixels arranged in a matrix,
    wherein each of the plurality of the first and second digital signal output units is provided in correspondence to a column of the pixels.

8. An image pickup system comprising:
    the photoelectric conversion apparatus according to claim 7;
    an optical system configured to form an image on the plurality of pixels; and
    an image signal processing unit configured to process a signal that is output from the photoelectric conversion apparatus to generate image data.

9. The signal transmission apparatus according to claim 1, wherein each of the first and second digital signal output units includes a memory unit configured to hold a digital signal and a switch configured to select one of a connected state and an unconnected state between the memory unit and one of the first and second block wirings, and
    wherein the first buffer output is connected to each switch of the second digital signal output unit.

10. A driving method of signal transmission apparatus, the signal transmission apparatus comprising:
    a plurality of digital signal output units including a plurality of first digital signal output units and a plurality of second digital signal output units, each of the plurality of digital signal output units configured to output a digital signal, first block wiring being connected to output terminals of the plurality of first digital signal output units, and second block wiring being connected to output terminals of the plurality of second digital signal output units, and first buffer circuit having first buffer input output and first buffer output, and second buffer circuit having second buffer input and second buffer output, the first buffer input being connected to the first block wiring, and the second buffer input being connected to the second block wiring, wherein each of the plurality of first and second digital signal output units outputs a digital signal to a corresponding one of the first and second block wirings in a selected state, and does not output the corresponding digital signal to the corresponding block wiring in an unselected state, the method comprising:

selecting the first digital signal output unit; and outputting the digital signal of the selected first digital signal output unit from the first buffer output to the second buffer input via the second block wiring.

* * * * *